United States Patent
Kirkpatrick et al.

(10) Patent No.: US 12,146,539 B2
(45) Date of Patent: Nov. 19, 2024

(54) COMPOSITES AND METHODS OF FORMING COMPOSITES HAVING FRICTION AND WEAR PLUGS

(71) Applicant: GOODRICH CORPORATION, Charlotte, NC (US)

(72) Inventors: Christopher T. Kirkpatrick, Pueblo West, CO (US); Gary C. Riebe, Troy, OH (US)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 18/469,422

(22) Filed: Sep. 18, 2023

(65) Prior Publication Data
US 2024/0003394 A1  Jan. 4, 2024

Related U.S. Application Data

(62) Division of application No. 17/142,985, filed on Jan. 6, 2021, now Pat. No. 11,796,021.

(Continued)

(51) Int. Cl.
*F16D 65/12* (2006.01)
*B29C 70/54* (2006.01)
(Continued)

(52) U.S. Cl.
CPC .......... *F16D 65/126* (2013.01); *B29C 70/54* (2013.01); *B29C 70/68* (2013.01); *C04B 35/62873* (2013.01); *C04B 35/62884* (2013.01); *C04B 35/83* (2013.01); *C23C 16/045* (2013.01); *F16D 69/023* (2013.01); *B29K 2307/04* (2013.01); *B29K 2707/04* (2013.01); *B29K 2709/02* (2013.01); *B29L 2031/16* (2013.01);
(Continued)

(58) Field of Classification Search
CPC ......... F16D 65/123–128; F16D 69/023; F16D 2065/1328; F16D 2200/0047; F16D 2200/0065; F16D 2200/0091; C04B 35/62873; C04B 35/62884; C04B 35/83; C04B 2235/422; C04B 2235/5248; C04B 2235/5252; C04B 2235/614; B29K 2707/04; B29K 2709/02; B29L 2031/16
USPC .................................................. 188/218 XL
See application file for complete search history.

(56) References Cited

U.S. PATENT DOCUMENTS 5,613,578 A   3/1997  Moseley et al.
6,193,027 B1  2/2001  Krenkel et al.
(Continued)

FOREIGN PATENT DOCUMENTS

KR    20100127513    12/2010

OTHER PUBLICATIONS

European Patent Office, European Partial Search Report dated Jul. 12, 2021 in Application No. 21152517.5.
(Continued)

*Primary Examiner* — Christopher P Schwartz
(74) *Attorney, Agent, or Firm* — SNELL & WILMER L.L.P.

(57) ABSTRACT

A friction disk may comprise a first wear surface formed from a carbon fiber-carbon matrix composite material. A wear plug may be located in an opening defined by the carbon fiber-carbon matrix composite material. The wear plug may extend axially from the wear surface. The wear plug may comprise a rod or a particulate.

4 Claims, 7 Drawing Sheets

Related U.S. Application Data

(60) Provisional application No. 62/970,513, filed on Feb. 5, 2020.

(51) Int. Cl.
*B29C 70/68* (2006.01)
*C04B 35/628* (2006.01)
*C04B 35/83* (2006.01)
*C23C 16/04* (2006.01)
*F16D 69/02* (2006.01)
*B29K 307/04* (2006.01)
*B29K 707/04* (2006.01)
*B29K 709/02* (2006.01)
*B29L 31/16* (2006.01)
*F16D 65/02* (2006.01)

(52) U.S. Cl.
CPC *C04B 2235/422* (2013.01); *C04B 2235/5248* (2013.01); *C04B 2235/5252* (2013.01); *C04B 2235/614* (2013.01); *F16D 2065/1328* (2013.01); *F16D 2200/0047* (2013.01); *F16D 2200/0065* (2013.01); *F16D 2200/0091* (2013.01)

(56) References Cited

U.S. PATENT DOCUMENTS

| | | |
|---|---|---|
| 9,279,467 B2 | 3/2016 | Hanna et al. |
| 11,448,274 B2 | 9/2022 | Kirkpatrick |
| 11,796,021 B2 * | 10/2023 | Kirkpatrick ........... C23C 16/045 |
| 2006/0108182 A1 | 5/2006 | Walker et al. |
| 2010/0000070 A1 * | 1/2010 | La Forest ............... C04B 35/83 |
| | | 156/60 |
| 2015/0128828 A1 | 5/2015 | La Forest et al. |
| 2017/0102043 A1 | 4/2017 | Opalka et al. |

OTHER PUBLICATIONS

European Patent Office, European Search Report dated Oct. 13, 2021 in Application No. 21152517.5.
USPTO; Restriction Requirement dated Jun. 23, 2022 in U.S. Appl. No. 17/142,985.
USPTO; Non-Final Office Action dated Feb. 27, 2023 in U.S. Appl. No. 17/142,985.
USPTO; Notice of Allowance dated Jul. 28, 2023 in U.S. Appl. No. 17/142,985.
European Patent Office, European Office Action dated Mar. 15, 2023 in Application No. 21152517.5.

* cited by examiner

COMPOSITES AND METHODS OF FORMING COMPOSITES HAVING FRICTION AND WEAR PLUGS

CROSS-REFERENCE TO RELATED APPLICATIONS

This application is a divisional of, claims priority to, U.S. application Ser. No. 17/142,985 filed Jan. 6, 2021 and titled "COMPOSITES AND METHODS OF FORMING COMPOSITES HAVING FRICTION AND WEAR PLUGS" (hereinafter the '985 application). The '985 application claims benefit of, U.S. Provisional Application Ser. No. 62/970,513, filed Feb. 5, 2020 and titled "COMPOSITES AND METHODS OF FORMING COMPOSITES HAVING FRICTION AND WEAR PLUGS." (hereinafter the '513 application). The '985 application and '513 application are hereby incorporated by reference in their entirety for all purposes.

FIELD

The present disclosure relates to composites, and more specifically, to composites having friction and wear plugs and methods of forming the same.

BACKGROUND

Aircraft brake systems typically employ a series of brake disks that, when forced into contact with each other, help stop the aircraft. The brake disks may comprise a carbon fiber-reinforced/carbon matrix (C/C) composite material. For example, in a brake system, the rotor friction disks, stator friction disks, pressure plates, and/or end plates may be comprised of C/C composite materials. Addition of friction and wear modifies, such as for example, ceramic particles, to the C/C composite materials may modify the friction and improve a wear rate of the friction disks. However, incorporating ceramic material into the C/C composite materials can be time consuming and, depending on the type of ceramic material and incorporation method (e.g., chemical vapor deposition), may pose environmental, health, and safety issues.

SUMMARY

A friction disk is disclosed herein. In accordance with various embodiments, the friction disk may comprise a first wear surface formed from a carbon fiber-carbon matrix composite material, and a first wear plug located in a first opening defined by the carbon fiber-carbon matrix composite material. The first wear plug may extend axially from the first wear surface.

In various embodiments, the first wear plug comprises a graphite rod. In various embodiments, the graphite rod comprises ceramic particles. In various embodiments, the first wear plug comprises carbon pitch.

In various embodiments, an axial length of the first wear plug is less than an axial thickness of the carbon fiber-carbon matrix composite material. In various embodiments, a second wear surface may be formed by the carbon fiber-carbon matrix composite material. The second wear surface is axially opposite the first wear surface. A second wear plug may be located in a second opening defined by the carbon fiber-carbon matrix composite material. The second wear plug extends axially from the second wear surface.

In various embodiments, the first wear plug may be located halfway between an outer diameter surface and an inner diameter surface of the friction disk. In various embodiments, the first wear plug extends completely through the carbon fiber-carbon matrix composite material.

In accordance with various embodiments, a friction disk may comprise a first wear surface formed from a carbon fiber-carbon matrix composite material, a first wear particulate located in a first opening defined by the carbon fiber-carbon matrix composite material, and a binder located in the first opening.

In various embodiments, the first wear particulate comprises graphite powder. In various embodiments, the first wear particulate comprises a mixture of graphite powder and ceramic powder. In various embodiments, the first wear particulate comprises carbon pitch particulate.

In various embodiments, an axial depth of the first opening is less than an axial thickness of the carbon fiber-carbon matrix composite material. In various embodiments, a second wear surface may be formed by the carbon fiber-carbon matrix composite material, wherein the second wear surface is axially opposite the first wear surface. A second opening may be defined by the carbon fiber-carbon matrix composite material and may extend axially from the second wear surface. A second wear particulate may be located in the second opening.

A method of making a carbon fiber-carbon matrix composite part is also disclosed herein. In accordance with various embodiments, the method may comprise densifying a fibrous preform by chemical vapor infiltration (CVI) to form a densified fibrous preform, forming a first opening in a first wear surface of the densified fibrous preform, and inserting a first wear plug in the first opening.

In various embodiments, the first wear plug comprises at least one of a graphite rod, a graphite rod having ceramic particles, or a carbon pitch rod.

In various embodiments, the first wear plug comprises a wear particulate including at least one of graphite powder, a mixture of graphite powder and ceramic powder, or carbon pitch powder.

In various embodiments, the method further comprises forming a second opening in a second wear surface of the densified fibrous preform, and inserting at least one of a second wear plug or a second wear particulate in the second opening.

In various embodiments, the method further comprises combining the first wear particulate with a binder, and depositing the binder and the first wear particulate into the first opening.

In various embodiments, forming the first opening comprises forming the first opening partially through the densified fibrous preform.

The foregoing features and elements may be combined in various combinations without exclusivity, unless expressly indicated herein otherwise. These features and elements as well as the operation of the disclosed embodiments will become more apparent in light of the following description and accompanying drawings.

Figure 1A:
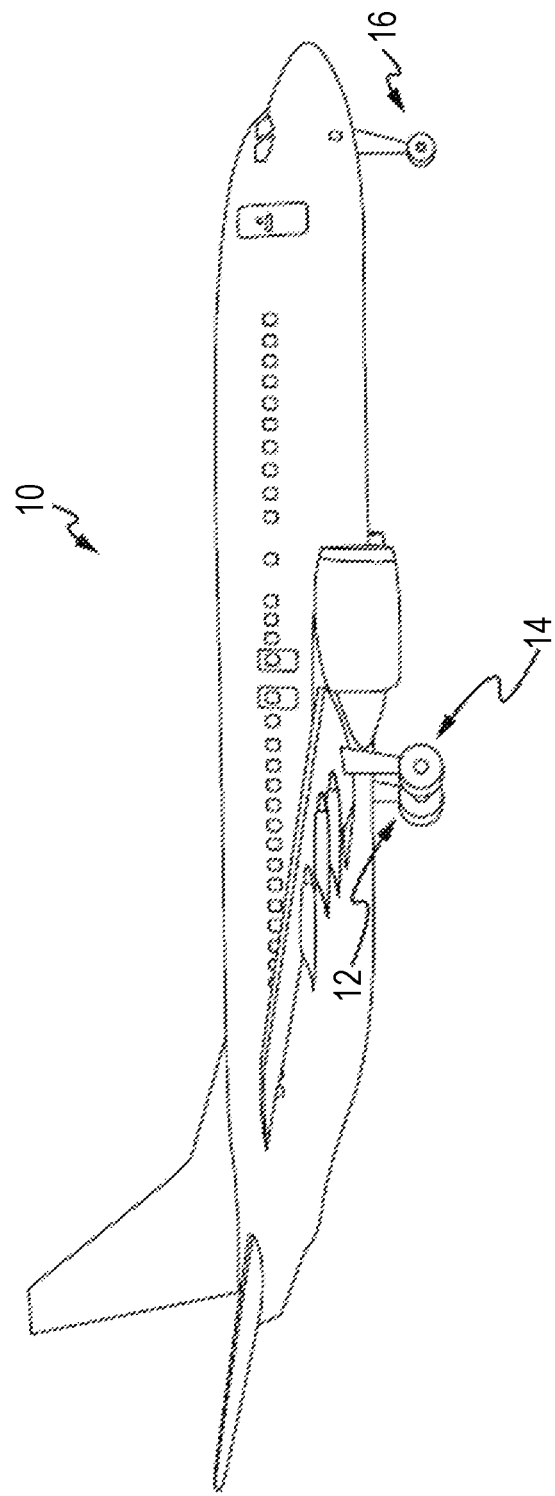
FIG. 1A illustrates an exemplary aircraft having a brake system, in accordance with various embodiments.

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

Provided herein, according to various embodiments, are fiber reinforced composite parts and method(s) for fabricating fiber reinforced composite parts, such as brake disks, having one or more wear plugs located therein. While numerous details are included herein pertaining to aircraft components, such as brake components, the manufacturing system(s) and method(s) disclosed herein can be applied to fabricate other ceramic matrix composite components.

Referring to FIG. 1A, in accordance with various embodiments, an aircraft 10 is illustrated. The aircraft 10 includes landing gear, which may include a left main landing gear 12, a right main landing gear 14, and a nose landing gear 16. The landing gear support the aircraft 10 when it is not flying, allowing the aircraft 10 to taxi, take off and land without damage. While the disclosure is directed generally to brake systems or mechanisms for aircraft, the principles disclosed herein may be equally applicable to brake systems or mechanisms used for other vehicles, such as, for example, those used on locomotives or cars for trains or on automobiles.

Figure 1B:
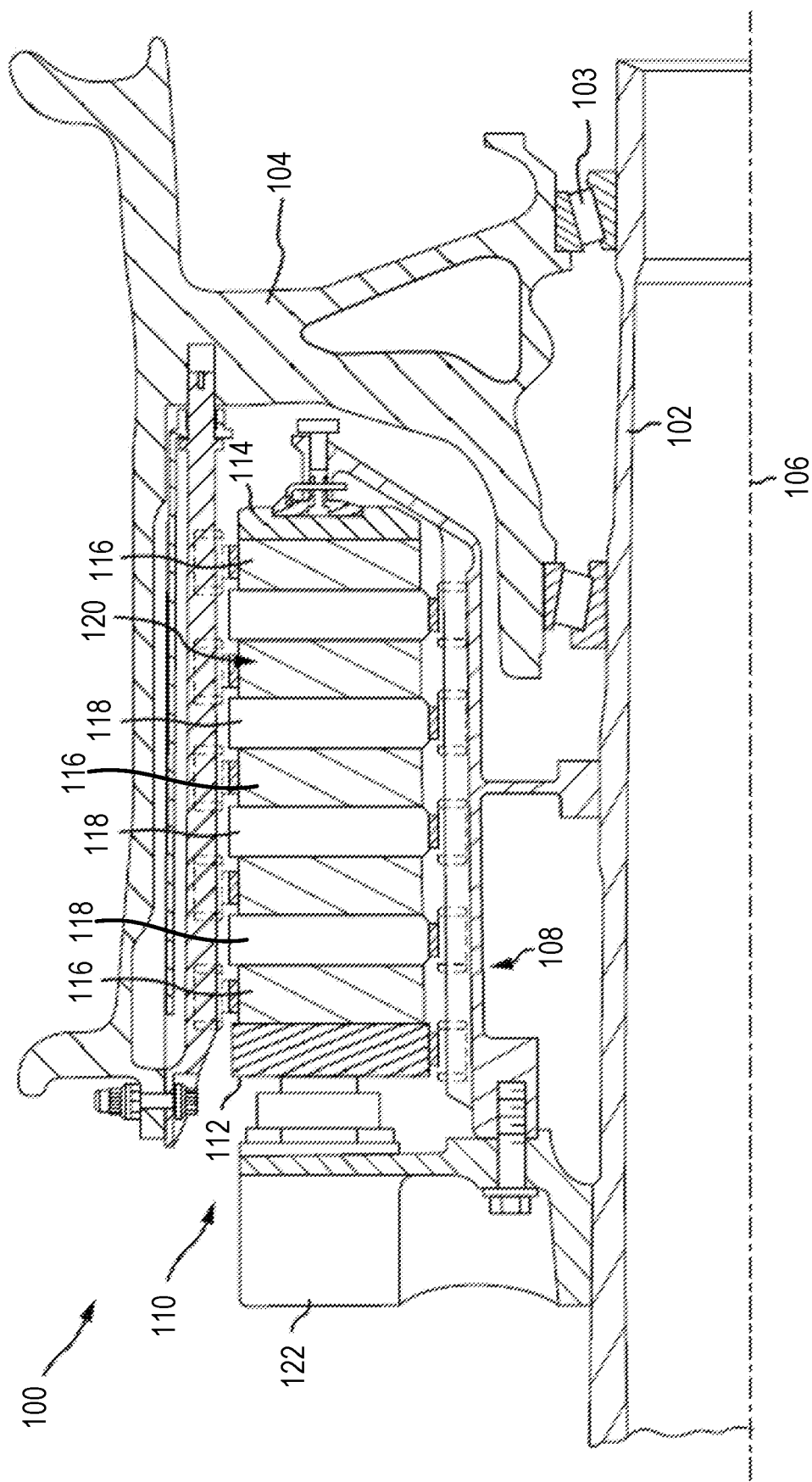
FIG. 1B illustrates a cross-sectional view of a brake assembly, in accordance with various embodiments.

Referring now to FIG. 1B, a brake assembly 100 is illustrated. Brake assembly 100 is configured for use on a landing gear, such as, for example, each of the left main landing gear 12 and the right main landing gear 14 described above with reference to FIG. 1A. In various embodiments, the brake assembly 100 is mounted on an axle 102 for use with a wheel 104 disposed on and configured to rotate about the axle 102 via one or more bearing assemblies 103. A central axis 106 extends through the axle 102 and defines a center of rotation of the wheel 104. A torque plate barrel 108 (sometimes referred to as a torque tube or barrel or a torque plate) is aligned concentrically with the central axis 106. The wheel 104 is rotatable relative to the torque plate barrel 108. As used herein, the term "axial" refers to directions parallel to central axis 106, the term "radial" refers to directions normal to central axis 106, and the "circumferential" refers to directions about central axis 106.

The brake assembly 100 includes a piston assembly 110, a pressure plate 112 disposed adjacent the piston assembly 110, an end plate 114 positioned a distal location from the piston assembly 110, and a plurality of rotor disks 116 interleaved with a plurality of stator disks 118 positioned intermediate the pressure plate 112 and the end plate 114. The pressure plate 112, the plurality of rotor disks 116, the plurality of stator disks 118, and the end plate 114 together form a brake heat sink or brake stack 120. The pressure plate 112, the end plate 114, and the plurality of stator disks 118 are mounted to the torque plate barrel 108 and remain rotationally stationary relative to the axle 102. The plurality of rotor disks 116 is mounted to the wheel 104 and rotate with respect to each of the pressure plate 112, the end plate 114, and the plurality of stator disks 118.

An actuating mechanism for the brake assembly 100 includes a plurality of piston assemblies, including the piston assembly 110, circumferentially spaced around a piston housing 122 (only one piston assembly is illustrated in FIG. 1B). Upon actuation, the plurality of piston assemblies affects a braking action by urging the pressure plate 112 and the plurality of stator disks 118 into frictional engagement with the plurality of rotor disks 116 and against the end plate 114. Through compression of the plurality of rotor disks 116 and the plurality of stator disks 118 between the pressure plate 112 and the end plate 114, the resulting frictional contact slows or stops or otherwise prevents rotation of the wheel 104. In various embodiments, and as described below with reference to FIGS. 2A and 2B, the plurality of rotor disks 116 and the plurality of stator disks 118 may be fabricated from fiber reinforced composite materials, such as, for example, carbon fiber-carbon matrix (C/C) composite materials, that enable the brake disks to withstand and dissipate the heat generated during and following a braking action.

Figure 2A:
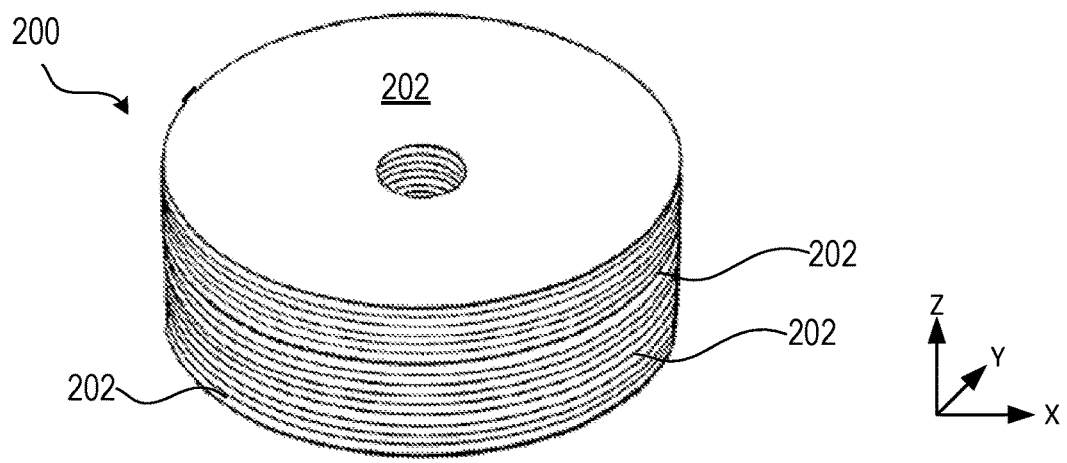
FIGS. 2A and 2B illustrate formation of a fibrous preform, in accordance with various embodiments.

Referring now to FIG. 2A, a fibrous preform 200 is illustrated, in accordance with various embodiments. The fibrous preform 200 may be employed to form one or more of the brake or heat sink components described above with reference to FIG. 1B (e.g., one or more of stator disks 118 or the rotor disks 116). The fibrous preform 200 may comprise a porous structure comprised of a plurality of stacked textile layers 202. A porous structure may comprise any structure derived from a fibrous material such as carbon fibers or the like. In various embodiments, the carbon fibers may be derived from polyacrylonitrile (PAN), rayon (synthetic fiber derived from cellulose), oxidized polyacrylonitrile fiber (OPF), pitch, or the like. The starting fiber may be pre-oxidized PAN or fully carbonized commercial carbon fiber. Fibrous preform 200 may be prepared by needling one or more textile layers 202. Needling the textile layers 202 tends to push fibers from one layer 202 to the next layer 202, thereby forming z-fibers that extend perpendicularly across the layers. Needling pulls fibers from the in-plane direction and forces them into the z-fiber direction. After needling, fibrous preform 200 may comprise fibers extending in three different directions (i.e., in the x-direction, the y-direction, and the z-direction).

Fibrous preform 200 may be fabricated using a net shape preforming technology or may be cut from a needled board. In various embodiments, fibrous preform 200 may be a 2D lay-up of woven, braided or knitted fabric. The fibrous material may be in the form of chopped carbon fibers molded to form a preform. Prior to the densification process, the fibrous material may be formed into a preform having any desired shape or form. For example, the fibrous preform may be in the form of a disk having any shape such as, for example, a polygon, a cylinder, a triangle, annular, square, rectangle, pentagon, hexagon, octagon, or the like. In addition, the fibrous preform may have an irregular form.

Figure 2B:
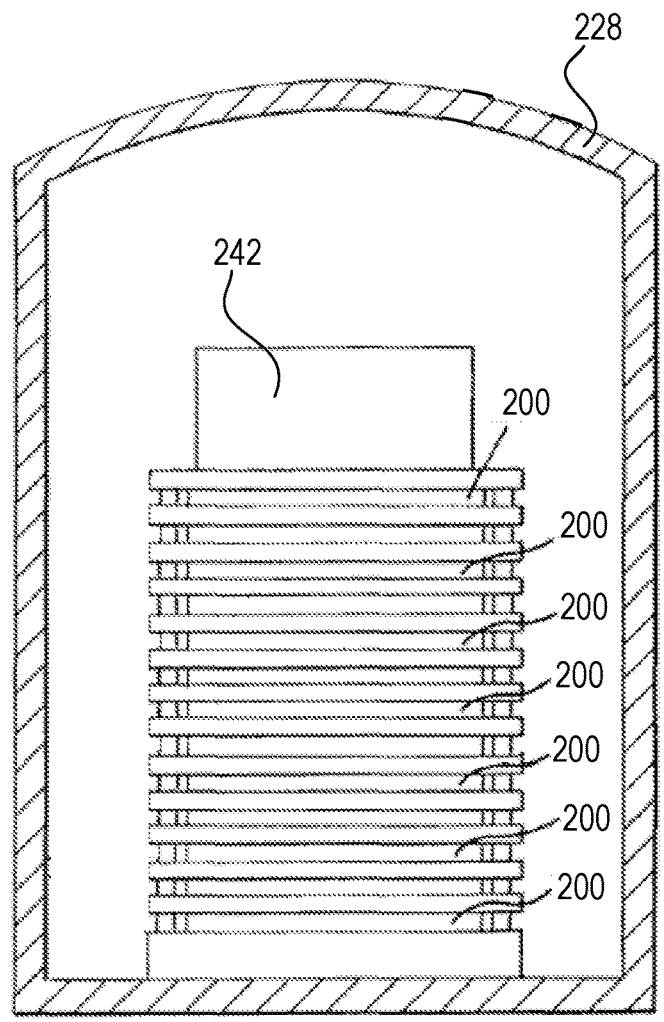

As shown in FIG. 2B, one or more of the fibrous preforms 200 may be placed in a furnace 228 for carbonization. The carbonization process may be employed to convert the fibers of the fibrous preforms 200 into pure carbon fibers, as used herein only "pure carbon fibers" means carbon fibers comprised of at least 99% carbon. The carbonization process is distinguished from the densification process described below in that the densification process involves infiltrating the pores of the fibrous preform 200 and depositing a carbon matrix within and around the carbon fibers of the fibrous preform, and the carbonization process refers to the process of converting the fibers of the fibrous preform 200 into pure carbon fibers.

In various embodiments, compressive pressure may be applied to fibrous preforms 200 during the carbonization process to increase the fiber volume of carbonized fibrous preforms 200. The compressive pressure may be applied by placing a weight 242 over fibrous preforms 200, or by applying a compressive load to the fibrous preform by other suitable means. The compressive pressure may be applied along the direction of the z-fibers. Applying compressive pressure to fibrous preforms 200 during the carbonization process tends to increase the after-carbonization fiber volume ratio of fibrous preforms 200. As used herein, "fiber volume ratio" means the ratio of the volume of the fibers of the fibrous preform to the total volume of the fibrous preform. For example, a fiber volume ratio of 25% means the volume of the fibers in the fibrous preform is 25% of the total volume of fibrous preform. In various embodiments, after carbonization, fibrous preform 200 comprises a fiber volume of 25% or greater. In various embodiments, after carbonization, fibrous preform 200 comprises a fiber volume of between 23% and 50%. In various embodiments, after carbonization, fibrous preform 200 comprises a fiber volume of between 25% and 40%.

After carbonization, fibrous preform 200 undergoes a chemical vapor infiltration (CVI) with carbon to form a C/C component—e.g., an annular shaped rotor disk or stator disk—having carbon fibers and a carbon matrix. In various embodiments, the CVI process is repeated until a desired density is achieved. In various embodiments, one or more heating steps may be performed during densification. After densification (i.e., after CVI of pyrolytic carbon), the densified preform may be machined to smooth the surfaces of the densified preform and/or to form the densified preform to the desired shape.

Figure 3:
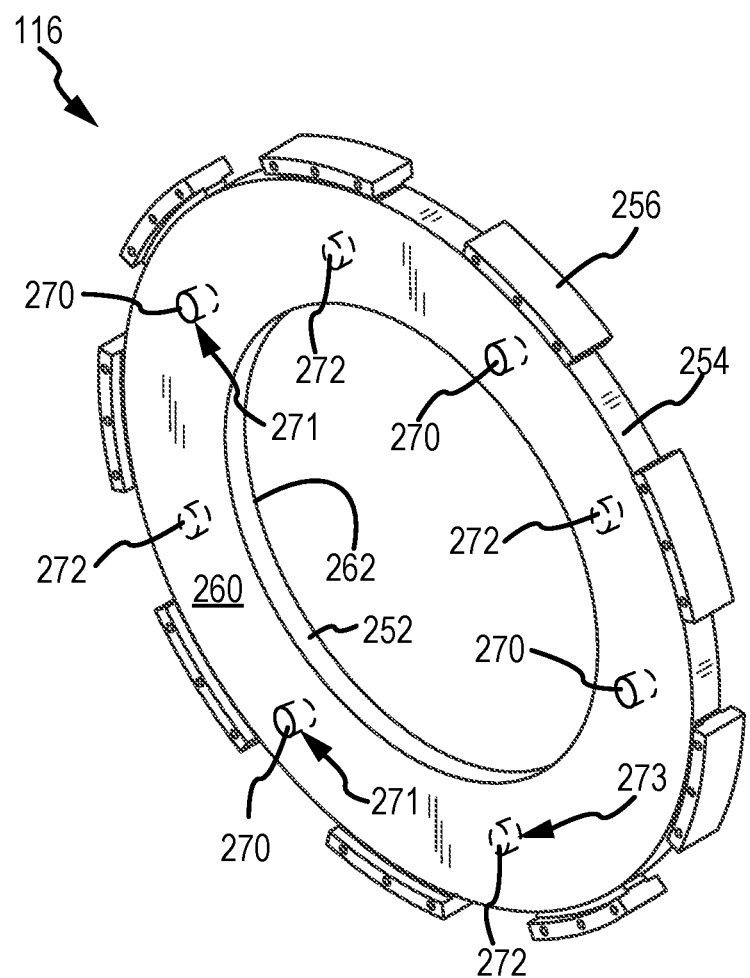
FIG. 3 illustrates a rotor disk having wear plugs extending partially through the axial thickness of the rotor disk, in accordance with various embodiments.

FIG. 3 illustrates a rotor disk 116 formed from a densified preform, as described above. Rotor disk 116 comprises a C/C composite material component. In accordance with various embodiments, rotor disk 116 includes an inner diameter surface 252 and an outer diameter surface 254. In various embodiments, brake assembly hardware, for example outer diameter rotor lugs 256 may be added to outer diameter surface 254 after densification of the preform and/or after machining of the densified preform. Rotor disk 116 includes a first wear surface 260 and a second wear surface 262 axially opposite the first wear surface 260. First and second wear surface 260, 262 extend from inner diameter surface 252 to outer diameter surface 254.

In accordance with various embodiments, one or more first wear plugs 270 may be located in rotor disk 116. First wear plugs 270 may be located in first openings 271 formed (e.g., drilled) into first wear surface 260 of rotor disk 116. First wear plugs 270 and first openings 271 may extend from first wear surface 260 partially through rotor disk 116. In this regard, a portion of the C/C composite material may be located axially between each of first wear plugs 270 and second wear surface 262. The axial lengths of first wear plugs 270 and first openings 271 are selected to be equal to or greater than the axial wear thickness of rotor disk 116. In this regard, when rotor disk 116 is in a fully worn state, a portion of first wear plug 170 may remain in the rotor disk. In various embodiments, first wear plugs 270 may be press fit into rotor disk 116, such that frictional forces couple first wear plug 270 to rotor disk 116. In this regard, the initial diameter of first openings 271 may be less than the diameter of first wear plugs 270. Insertion of first wear plugs 270 into first openings 271 may increase the diameter of first openings 271 from the initial diameter to a diameter equal to the diameter of first wear plugs 270.

In various embodiments, first wear plugs 270 are located in a "hot band" of rotor disk 116. As used herein, the term "hot band" refers to an area of a friction disk that experiences the greatest temperatures during braking. The hot band of rotor disk 116 is generally midway between inner diameter surface 252 and outer diameter surface 254. Thus, in various embodiments, first wear plugs 270 may be located equal distance from inner diameter surface 252 and outer diameter surface 254. In various embodiments, first wear plugs 170 may be radially staggered, such that a first group of first wear plugs 270 is closer to outer diameter surface 254 as compared to a second group of first wear plugs 270. In various embodiments, first wear plugs 270 are evenly spaced in the circumferential direction, such that each first wear plug 270 is equal distance from the circumferentially adjacent first wear plugs 270.

In accordance with various embodiments, one or more second wear plugs 272 may be located in rotor disk 116. Second wear plugs 272 may be located in second openings 273 formed (e.g., drilled) into second wear surface 262 of rotor disk 116. Second wear plugs 272 and second openings 273 may extend from second wear surface 262 partially through rotor disk 116. In this regard, a portion of the C/C composite material may be located axially between each of second wear plugs 272 and first wear surface 260. The axial lengths of second wear plugs 272 and second openings 273 are selected to be equal to or greater than the axial wear thickness of rotor disk 116. In this regard, when rotor disk 116 is in a fully worn state, a portion of second wear plug 272 may remain in the rotor disk. In various embodiments, second wear plugs 272 may be press fit into rotor disk 116, such that frictional forces couple second wear plug 272 to rotor disk 116. In this regard, the initial diameter of second openings 273 may be less than the diameter of second wear plugs 272. Insertion of second wear plugs 272 into second openings 273 may increase the diameter of second openings 273 from the initial diameter to a diameter equal to the diameter of second wear plugs 272.

In various embodiments, second wear plugs 272 are located in a hot band of rotor disk 116. Thus, in various embodiments, second wear plugs 272 may be located equal distance from inner diameter surface 252 and outer diameter surface 254. In various embodiments, second wear plugs 272 may be radially staggered, such that a first group of second wear plugs 272 is closer to outer diameter surface 254 as compared to a second group of second wear plugs 272. In various embodiments, second wear plugs 272 are evenly spaced in the circumferential direction, such that each second wear plug 272 is equal distance from the circumferentially adjacent second wear plugs 272.

In accordance with various embodiments, first and second wear plugs 270, 272 comprise a wear and/or lubricating material configured to modify and/or reduce the wear rate of the C/C composite material of rotor disk 116. In various embodiments, first and second wear plugs 270, 272 may comprise a graphite rod. In various embodiments, first and second wear plugs 270, 272 may comprise a graphite rod including ceramic particles. In various embodiments, first and second wear plugs 270, 272 may comprise a graphite rod having nanometer sized ceramic particles. The ceramic particles may be, for example, hexagonal boron nitride, zirconium dioxide ($ZrO_2$), titanium diboride ($TiB_2$), boron carbide ($B_4C$), or any desired ceramic particle. In various embodiments, first and second wear plugs 270, 272 may comprise carbon pitch particles, such as for example, pyrolyzed mesophase carbon pitch particles. Incorporating pyrolyzed mesophase carbon pitch particles via a preformed rod and after formation (e.g., densification) of the friction disk, tends to reduce or eliminate the environmental health and safety issues associated with other carbon pitch infiltration methods. First and second wear plugs 270, 272 are configured such that as rotor disk 116 wears, the material of first and wear plugs 270, 272 gets introduced at the wear interface (i.e., between the wear surface of rotor disk 116 and the wear surface of the adjacent friction disk). Introducing the material of first and wear plugs 270, 272 (e.g., graphite, ceramic, carbon pitch, etc.) at the wear interfaces may modify and/or improve the wear rate of rotor disk 116.

Figure 4:
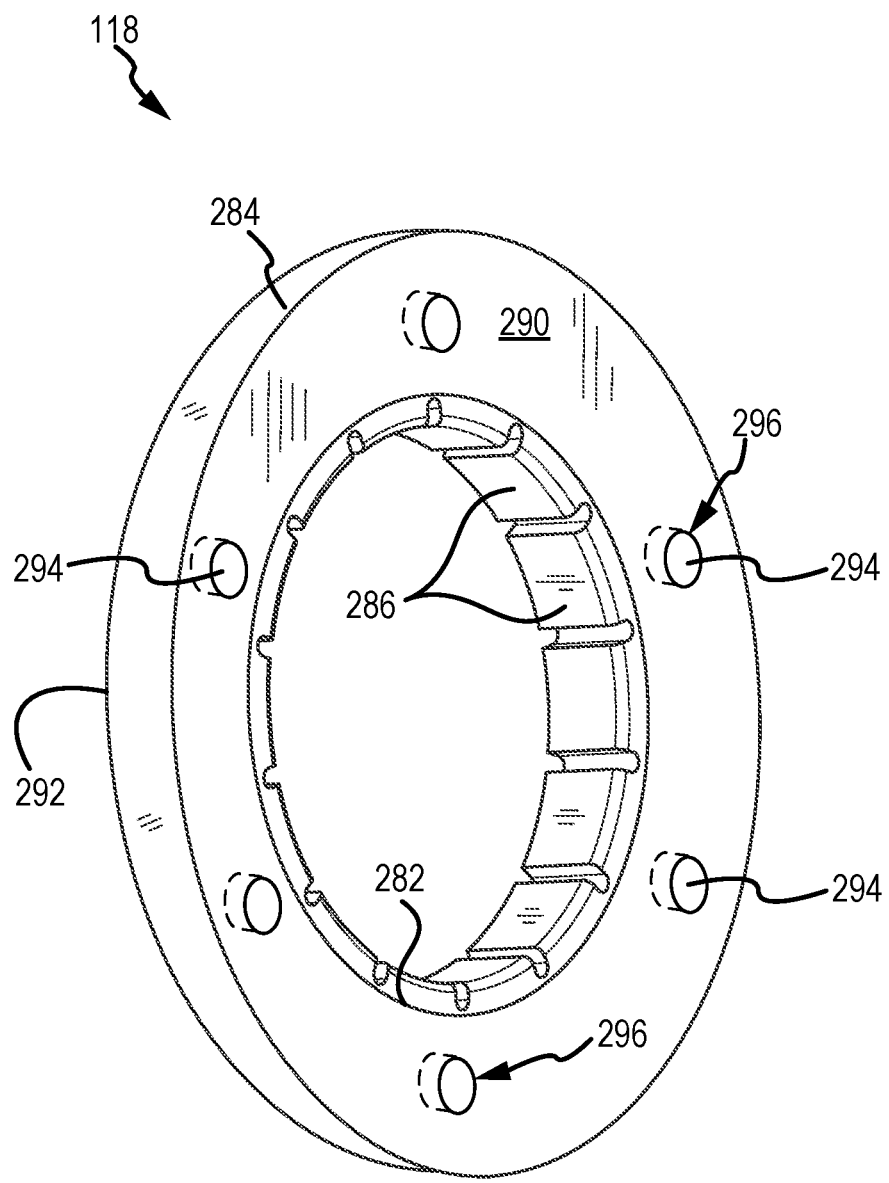
FIG. 4 illustrates a stator disk having wear plugs extending completely through the axial thickness of the stator disk, in accordance with various embodiments.

With reference to FIG. 4, a stator disk 118 formed from a densified preform, as described above with reference to FIGS. 2A and 2B is illustrated. Stator disk 118 comprises a C/C composite material component. In accordance with various embodiments, stator disk 118 includes an inner diameter surface 282 and an outer diameter surface 284. In various embodiments, brake assembly hardware, for example inner diameter stator lugs 286 may be added to inner diameter surface 284 after densification of the preform and/or after machining of the densified preform. Stator disk 118 includes a first wear surface 290 and a second wear surface 292 axially opposite the first wear surface 290. First and second wear surface 290, 292 extend from inner diameter surface 282 to outer diameter surface 284.

In accordance with various embodiments, one or more wear plugs 294 may be located in stator disk 118. Wear plugs 294 may be located in openings 296 formed (e.g., drilled) through stator disk 118. Wear plugs 294 and openings 296 may extend completely through stator disk 118 (i.e., from first wear surface 290 to second wear surface 292). In various embodiments, wear plugs 294 may be press fit into stator disk 117, such that frictional forces couple wear plugs 294 to stator disk 118. In this regard, an initial diameter of openings 296 may be less than the diameter of wear plugs 294. Insertion of wear plugs 294 into openings 296 may increase the diameter of openings 296 from the initial diameter to a diameter equal to the diameter of wear plugs 294.

In various embodiments, wear plugs 294 are located in the hot band of stator disk 118. Thus, in various embodiments, wear plugs 294 may be located equal distance from inner diameter surface 282 and outer diameter surface 284. In various embodiments, wear plugs 294 may be radially staggered, such that a first group of wear plugs 294 is closer to outer diameter surface 284 as compared to a second group of wear plugs 294. In various embodiments, wear plugs 294 are evenly spaced in the circumferential direction, such that each wear plug 294 is equal distance from the circumferentially adjacent wear plugs 294.

In accordance with various embodiments, wear plugs 294 comprise a wear and/or lubricating material configured to modify and/or reduce the wear rate of the C/C composite material of stator disk 118. In various embodiments, wear plugs 294 may comprise a graphite rod. In various embodiments, wear plugs 294 may comprise a graphite rod including ceramic particles. In various embodiments, wear plugs 294 may comprise a graphite rod having nanometer sized ceramic particles. The ceramic particle may be, for example, hexagonal boron nitride, $ZrO_2$, $TiB_2$, $B_4C$, or any desired ceramic particle. In various embodiments, wear plugs 294 may comprise carbon pitch particles, such as for example, pyrolyzed mesophase carbon pitch particles. Incorporating pyrolyzed mesophase carbon pitch particles via a preformed rod and after formation of the C/C composite material of the friction disk, tends to reduce or eliminate the environmental health and safety issues associated with other carbon pitch infiltration methods. Wear plugs 294 are configured such that as stator disk 118 wears, the material of wear plugs 294 gets introduced at the wear interface (i.e., between the wear surface of stator disk 118 and the wear surface of the adjacent rotor disk). Introducing the material of wear plugs 294 (e.g., graphite, ceramic, carbon pitch, etc.) at the wear interface may modify and/or improve the wear rate of stator disk 118.

While FIG. 3 illustrates a rotor disk 116 having wear plugs extending only partially through the axial thickness of the friction disk, it is contemplated and understood that rotor disks 116 may include wear plugs extending completely through rotor disk 116, similar to wear plugs 294 in FIG. 4. While FIG. 4 illustrates a stator disk 118 having wear plugs that extend completely through the axial thickness of the friction disk, it is contemplated and understood that stator disks 118 may include wear plugs extending partially through stator disk 118, similar to first and second wear plugs 270, 272 in FIG. 3. Further, in various embodiments, pressure plate 112 and/or end plate 114, in FIG. 1B, may include wear plugs located in their respective wear surface and extending partially through friction disk, similar to first wear plugs 270 in FIG. 3.

Figure 5:
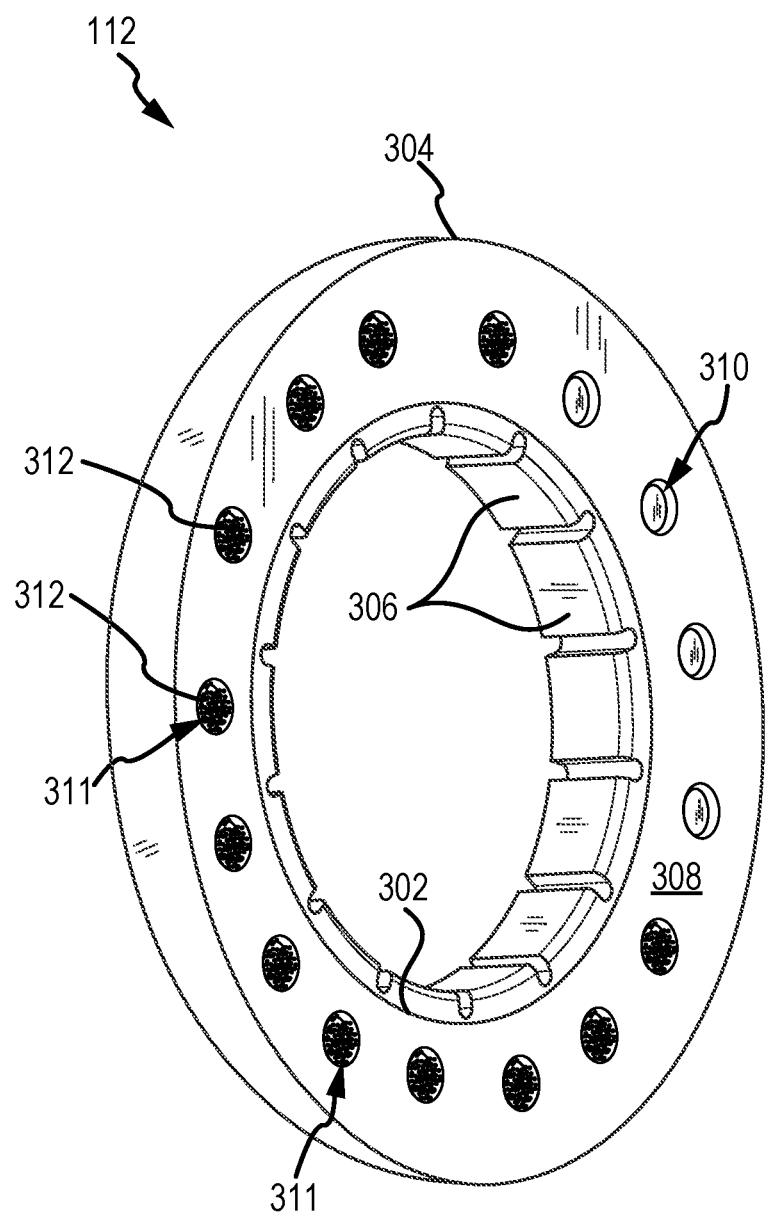
FIG. 5 illustrates a pressure plate having wear particulate deposited in openings defined by the C/C composite material of the pressure plate, in accordance with various embodiments.

With reference to FIG. 5, in accordance with various embodiments, a pressure plate 112 formed from the a densified preform, as described above with reference to FIGS. 2A and 2B is illustrated. Pressure plate 112 comprises a C/C composite material component. In accordance with various embodiments, pressure plate 112 includes an inner diameter surface 302 and an outer diameter surface 304. In various embodiments, brake assembly hardware, for example inner diameter stator lugs 306 may be added to inner diameter surface 302 after densification of the preform and/or after machining of the densified preform. Pressure plate 112 includes a first wear surface 308. Wear surface 308 extends from inner diameter surface 302 to outer diameter surface 304.

In accordance with various embodiments, the C/C composite material of pressure plate 112 defines openings 310. Openings 310 may extend partially through the C/C composite material in the axial direction. In various embodiments, openings 310 may extend completely through the C/C composite material. A wear plug 311 is located in each of openings 310. Wear plug 311 may be formed by depositing a wear particulate 312 (or powder) into openings 310. The wear particulate is configured to modify the wear rate and/or lubricate wear surface 308. In various embodiments, wear particulate 312 may include graphite powder. In various embodiments, wear particulate 312 may include a mixture of graphite powder and ceramic material in the form of ceramic powder. Suitable ceramic powders may include, for example, silicon carbide (SiC), boron (B), boron carbide ($B_4C$), silicon nitride ($Si_3N_4$), titanium diboride ($TiB_2$), or other similar oxides, borides, or nitrides, or any desired ceramic material. A range of particle sizes (or powder sizes) may be employed to fabricate the wear particulate 312. For example, in various embodiments, a micron-sized particulate may be selected. In various embodiments, the powder size may include a particle size distribution such as a bimodal particle distribution. In various embodiments, the powder size (or the powder size distribution) may be selected based on a desired grain size with smaller powder sizes yielding smaller grain sizes. For example, a nanoparticle-sized powder is typically found to yield a smaller grain size than a micrometer-sized powder. The grain size may also impact the thermal properties of the finished component. In various embodiments, uniformity of the dimensions or size of individual particles of the powder (e.g., a particle uniformity) may vary. For example, the particle uniformity may vary in characteristic dimension (e.g., diameter) by as much as +/−80%. In various embodiments, the particle size or uniformity may also vary according to a Gaussian distribution or by other industrially accepted variances.

In various embodiments, an upper size limit may vary, but limits on the order of about 5 μm (≈0.0002 in), about 10 μm (≈0.0004 in), about 20 μm (≈0.0008 in), about 50 μm (≈0.002 in), about 100 μm (≈0.004 in), about 150 μm (≈0.006 in), about 200 μm (≈0.008 in) or about 300 μm (≈0.012 in) are contemplated. A lower size limit, on the other hand, may also vary, but is typically dictated by commercial availability. For example, a lower size limit may be on the order of about ten nanometers (10 nm) $4 \times 10^{-7}$ in), about 50 nm $2 \times 10^{-6}$ in), about 100 nm $4 \times 10^{-5}$ in), about 500 nm $2 \times 10^{-5}$ in), about 5 μm (≈0.0002 in), about 10 μm (≈0.0004 in), about 20 μm 0.0008 in), or about 50 μm 0.002 in).

In various embodiments, a binder may be added to the wear particulate 312. The binder may comprise one or more of a polyvinyl alcohol (PVA), a phenolic resin, a sugar and a water component. In addition to PVA, the binder may comprise other water soluble polymers, such as, for example, polyvinylpyrrolidone (PVP), polyvinyl acetate, poly (2-oxazoline), polyacrylamide (PAM), hydro ethylcellulose, polyethyleneimine (PEI) or polyacrylate (PAA). In various embodiments, the binder may comprise a solution containing PVA and water. Similarly, in various embodiments, the binder may comprise a solution containing PVA, water and sugar. In various embodiments, the binder may be added to the wear particulate and then the wear particulate with binder may be injected into the openings. In various embodiments, the binder may be added to the wear particulate after depositing the wear particulate into the openings.

Wear plugs 311 are configured such that as pressure plate 112 wears, the particulate 312 of wear plugs 311 gets introduced at the wear interface (i.e., between the wear surface of pressure plate 112 and the wear surface of the adjacent rotor disk). Introducing particulate 312 at the wear interface may modify and/or improve the wear rate of pressure plate 112. While FIG. 5 illustrates a pressure plate 112 having wear plugs formed by depositing wear particulate into openings forming in the wear surface of the friction disk, it is contemplated and understood that rotor disks 116, stator disks 118, or end plate 114, with momentary reference to FIG. 1B, may include wear plugs comprised of wear particulate, similar to wear plugs 311.

Figure 6:
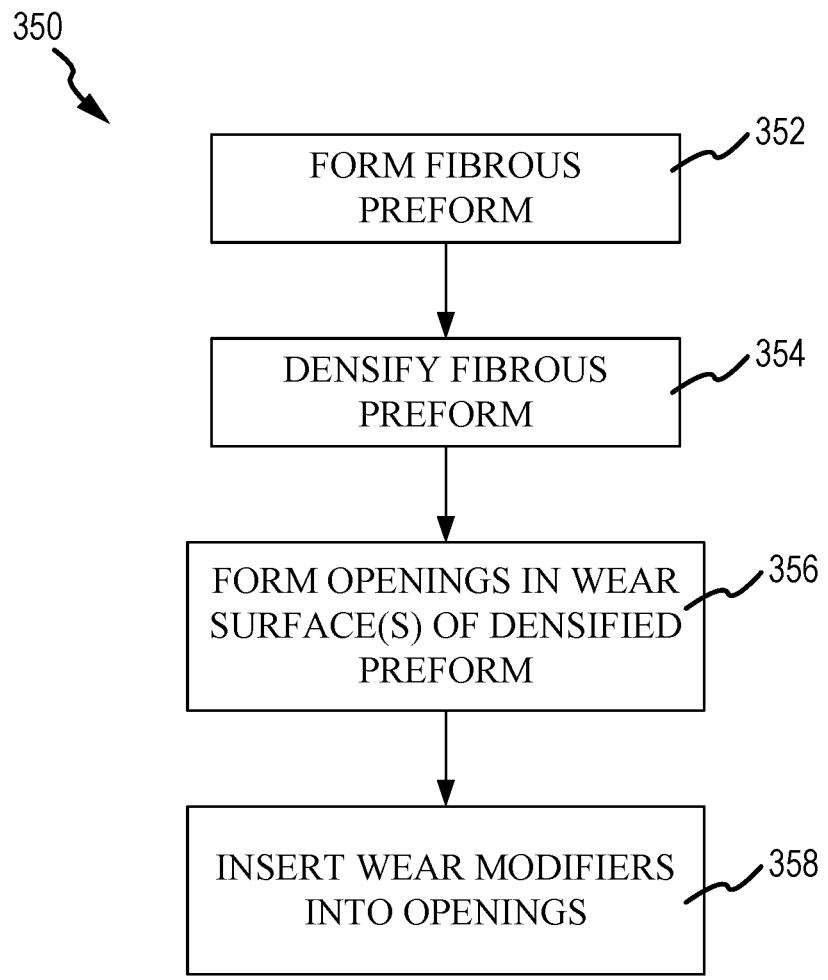
FIG. 6 illustrates a method of making a carbon fiber-carbon matrix composite part, in accordance with various embodiments.

With reference to FIG. 6, a method 350 of making a carbon fiber-carbon matrix composite part is illustrated. Method 350 may comprise forming a fibrous preform (step 352). Step 352 may comprise carbonizing the fibrous preform. In various embodiments, step 352 may include fabricating the fibrous preform to have a fiber volume ratio of 25% or greater.

Method 350 further comprises densifying the fibrous preform (step 354). Step 354 may include densifying the fibrous preform by chemical vapor infiltration (CVI) to form a densified fibrous preform.

Method 350 further comprises forming openings in one or more of the wear surface of the densified preform (step 356). In various embodiments, step 356 may include forming a first opening in a first wear surface of the densified fibrous preform. In various embodiments, step 356 may include forming a second opening in a second wear surface of the densified fibrous preform. In various embodiments, step 356 may include forming the first and/or second opening partially through the carbon fiber-carbon matrix composite part. In various embodiments, step 356 may include forming the first opening and/or the second opening completely through the carbon fiber-carbon matrix composite part. In various embodiments, step 356 may including forming the first opening and/or the second opening in a hot band of the carbon fiber-carbon matrix composite part.

Method 350 further comprises inserting a wear modifier into the openings (step 358). In various embodiments, step 358 may include inserting wear plugs into the openings. In various embodiments, the wear plugs may comprise at least one of a graphite rod, a graphite rod having ceramic particles, or a carbon pitch rod. In various embodiments, step 358 may include inserting a wear particulate in the openings. In various embodiments, step 358 may include injecting a combination of binder and wear particulate into the openings. In various embodiments, step 358 may include inserting a wear particulate in the openings and then depositing a binder into the openings.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a carbon fiber-carbon matrix composite part, comprising:
    densifying a fibrous preform by chemical vapor infiltration (CVI) to form a densified fibrous preform;
    forming a first opening in a first wear surface of the densified fibrous preform; and
    inserting a first wear plug in the first opening, wherein the first wear plug includes:
    a graphite rod;
    a binder, and
    a first wear particulate, the first wear particulate including at least one of graphite powder, a mixture of graphite powder and ceramic powder, or carbon pitch particulate.

2. The method of claim 1, further comprising:
    forming a second opening in a second wear surface of the densified fibrous preform; and
    inserting at least one of a second wear plug or a second wear particulate in the second opening.

3. The method of claim 1, further comprising:
    combining the first wear particulate with the binder; and
    depositing the binder and the first wear particulate into the first opening.

4. The method of claim 1, wherein forming the first opening comprises forming the first opening partially through the densified fibrous preform.

* * * * *